United States Patent [19]
Sato

[11] Patent Number: 5,693,979
[45] Date of Patent: Dec. 2, 1997

[54] SEMICONDUCTOR DEVICE

[75] Inventor: Fumihiko Sato, Tokyo, Japan

[73] Assignee: NEC Corporation, Tokyo, Japan

[21] Appl. No.: 677,335

[22] Filed: Jul. 2, 1996

Related U.S. Application Data

[63] Continuation of Ser. No. 340,430, Nov. 14, 1994, abandoned, which is a continuation of Ser. No. 22,094, Feb. 25, 1993, abandoned.

[30] Foreign Application Priority Data

Feb. 26, 1992  [JP]  Japan  .................... 4-038928

[51] Int. Cl.⁶ ............................................. H01L 27/082
[52] U.S. Cl. .................... 257/588; 257/592; 257/757; 437/31
[58] Field of Search ............................ 257/588, 592, 257/757, 565, 587; 437/32

[56] References Cited

U.S. PATENT DOCUMENTS

| | | | |
|---|---|---|---|
| 3,915,767 | 10/1975 | Welliver | 257/592 |
| 4,975,381 | 12/1990 | Taka et al. | 257/588 |
| 5,117,271 | 5/1992 | Comfort et al. | 257/588 |
| 5,204,276 | 4/1993 | Nakajima et al. | 437/31 |
| 5,214,302 | 5/1993 | Uchida et al. | 257/757 |
| 5,296,391 | 3/1994 | Sato et al. | 437/31 |

*Primary Examiner*—J. Carroll
*Attorney, Agent, or Firm*—Sughrue, Mion, Zinn, Macpeak & Seas, PLLC

[57] ABSTRACT

A semiconductor device having a first insulation film, a base contact and a second insulation film on a semiconductor substrate. The first and second insulation films and the base contact respectively have openings which forms a hole extending therethrough on the substrate. An end of the base contact is projected over the substrate in the hole. A base connection region is in contact with the side and bottom faces of the projected end of the base contact and with a surface of a base region in the hole. An emitter region is formed in the base region. Reduced contact resistance between the base contact and the base connection region can be obtained.

31 Claims, 5 Drawing Sheets

SEMICONDUCTOR DEVICE

This is a continuation of U.S. patent application Ser. No. 08/340,430, filed Nov. 14, 1994, abandoned, which is a continuation of application Ser. No. 08/022,094, filed Feb. 25, 1993, now abandoned.

BACKGROUND OF THE INVENTION

1. Field of the Invention

The present invention relates to a semiconductor device and more particularly, to a semiconductor device such as a bipolar transistor, which has such a structure that a contact region is formed on an insulation film on a semiconductor substrate and an end portion of the contact region is projected over the substrate.

2. Description of the Related Art

Figure 1:
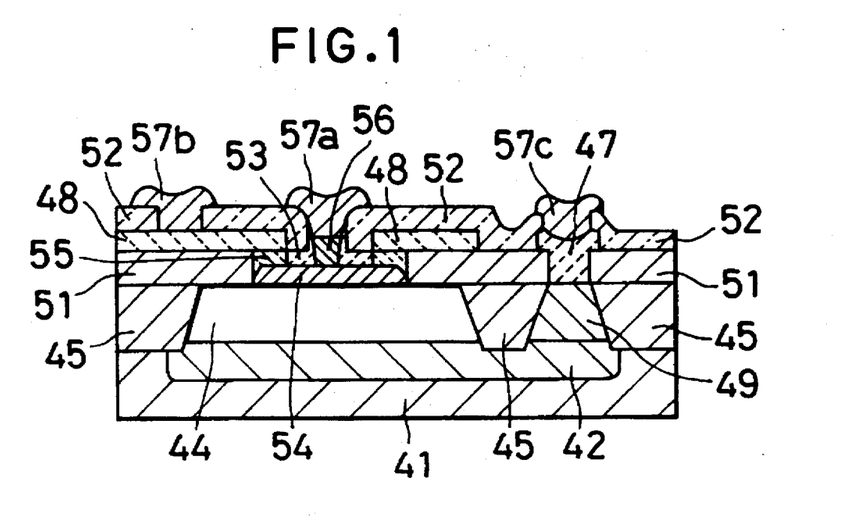
FIG. 1 is a cross-sectional view of a conventional semiconductor device.

A conventional bipolar transistor having the above-described structure is shown in FIG. 1.

In FIG. 1, in a p⁻-silicon substrate 41 having resistivity of approximately 10Ω·cm, an n⁺-buried layer 42 is formed which is obtained by arsenic diffusion. An n⁻-epitaxial layer 44 whose impurity concentration and thickness are approximately $5\times10^{15}$ cm$^{-3}$ and approximately 1.8 μm respectively is formed on the substrate 41. The layer 44 is isolated by field oxides 45 from other devices.

A silicon nitride film 51, which has a first and second openings, is formed on the epitaxial layer 44 and field oxides 45, and a base contact 48 of a no impurity-doped polysilicon film is formed on the silicon nitride film 51 around the opening. The base contact 48 has an opening which is disposed so as to be superposed on the first opening (left in FIG. 2) of the film 51.

The surface of the base contact 48 and the exposed surface of the silicon nitride film 51 are covered with a silicon dioxide film 52. An n⁺ region 49 is formed below the second opening (right in FIG. 2) of the film 51 by phosphorus diffusion in the epitaxial layer 44. In the second opening, a polysilicon collector contact 47 is formed, the bottom and top ends of the contact 47 being connected to the top end of the n⁺ region 49 and the bottom end of a collector electrode 57c made of an aluminum system metal, respectively.

Within the first opening of the silicon nitride film 51, an intrinsic base region 54 made of p-single-crystal silicon whose impurity concentration and thickness are $3\times10^{18}$ cm and 60 nm respectively is formed on the epitaxial layer 44. On the base region 54, an emitter region 56 is formed in the center and a silicon dioxide sidewall spacer 53 and a polysilicon outer base region 55 are formed so as to surround the emitter region 56.

The outer base region 55 is positioned just below the end portion of the base contact 48 projected like a visor or a overhang parallel to the substrate 41 over the first opening of the film 51. The sidewall spacer 53 is in contact with the bottom and side faces of the end portion of the silicon dioxide film 52, the portion entering into the opening of the base contact 48.

An emitter electrode 57a made of aluminum system metal is connected with the upper end of the emitter region 56 within the opening of the base contact 48. A base electrode 57b made of aluminum system metal is connected with the top end of the base contact 48 through the opening of the silicon dioxide film 52.

With the above-described conventional bipolar transistor, the intrinsic base region 54 is formed on the epitaxial layer 44 by the selective growth technique, and the entire side face of the projected end portion of the base contact 48 is covered with the silicon dioxide film 52 in a process prior to the selective growth. Thus, the outer base region 55 is formed only just below the projected end portion in a subsequent process. Then, to reduce the contact resistance between the base contact 48 and the outer base region 55, it is required that the outer base region 55 is formed so as to be in contact with the end face of the silicon nitride film 51, so that the contact area therebetween becomes as large as possible. However, it is very difficult to be realized because a gap tends to be formed between the outer base region 55 and the film 51.

SUMMARY OF THE INVENTION

Therefore, an object of the present invention is to provide a semiconductor device with such a structure that a contact region is formed on an insulation film on a semiconductor substrate and an end portion of the contact region is projected over the substrate, in which reduced contact resistance between the contact region and a connection region to be formed in contact with the region can be obtained.

The semiconductor device according to the present invention comprises a first insulation film formed on a semiconductor substrate of a first conductive type, a first contact region formed on the first insulation film, and a second insulation film formed on the first contact region. The first and second insulation films and the first contact region respectively have openings which forms a hole extending through the films and the region on the substrate. An end of the first contact region is projected over the substrate in the hole.

There are provided with in the hole, a first active region (e.g., a base) of a first conductive type formed on the substrate, a second active region (e.g., an emitter) of a second conductive type inverse in polarity with the first conductive type being in contact with the first active region, a connection region for connecting the first active region to the first contact region, an insulator formed between the first contact region and the second active region, and a second contact region connected to the second active region.

The connection region is in contact with the side and bottom faces of the projected end of the first contact region as well as with the surface of the first active region.

The second active region may be formed in or on the first active region.

The connection region may be formed of one polysilicon layer of the second conductive type, and preferably formed of a polysilicon layer of the second conductive type and a polycrystalline silicon-germanium alloy layer of the second conductive type. In case of the two layers being used, preferably, the polysilicon layer is in contact with the first contact region and the polycrystalline silicon-germanium alloy layer with the first active region.

The first active region may be formed of one single-crystal silicon layer of the first conductive type, and preferably formed of a single-crystal silicon layer of the first conductive type and a single-crystal silicon-germanium alloy layer of the first conductive type. In case of the two layers being used, preferably, the single-crystal silicon layer is in contact with the substrate and the single-crystal silicon-germanium alloy layer with the second active region.

There may be provided with a silicide film of refractory metals between the first contact region and the second insulation film.

The first and second insulation films may be formed of one layer of silicon dioxide or silicon nitride, and they may be of multi-layer structure composed of two or more insulation layers, respectively.

Similarly, the insulator between the first contact region and the second active region may be formed of one layer of silicon dioxide or silicon nitride, and preferably it is of multi-layer structure composed of two or more insulation layers.

A ratio between the total thickness of the first contact region t and the height (length perpendicular to the substrate) h of the side face area being in contact with the connection region, or (t/h), preferably satisfied with the following relation:

0<(h/t)≦0.5

With the semiconductor device according to the present invention, because the connection region is in contact with the side and bottom faces of the projected end of the first contact region, the contact area between the connection region and the first contact region can be larger than that of the conventional semiconductor device. Accordingly, the contact resistance therebetween can be reduced.

DESCRIPTION OF THE PREFERRED EMBODIMENTS

Preferred embodiments of the present invention will be described below while referring to FIGS. 2 to 8.
[First Embodiment]

Figure 2:
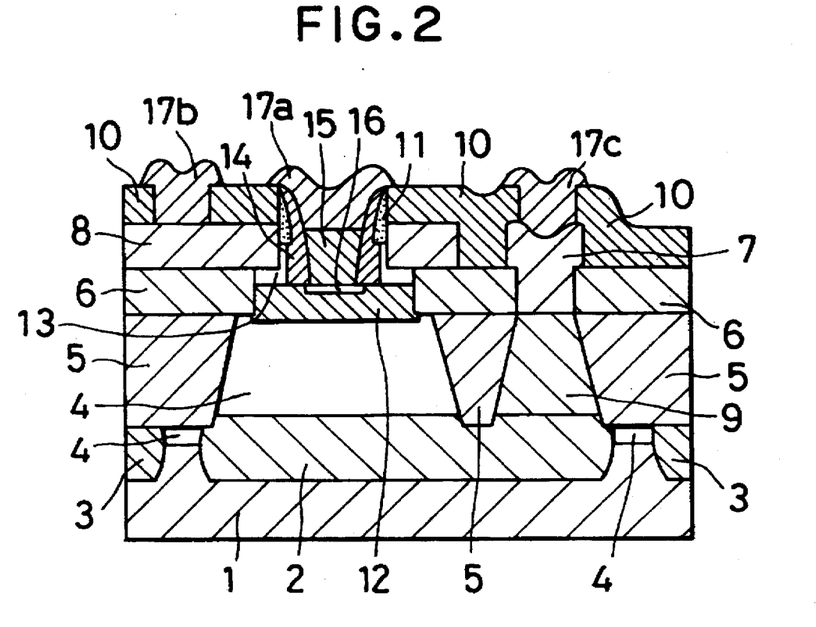
FIG. 2 is a cross-sectional view of a semiconductor device according to a first embodiment of the present invention.

An npn-bipolar transistor according to a first embodiment of the present invention is shown in FIG. 2.

In FIG. 2, In a $p^-$-silicon substrate 1 having resistivity of 10 to 20 Ω·cm and surface orientation (100), an $n^+$-buried layer 2 and $p^+$-buried layers 3 for channel stops are formed. An n-silicon epitaxial layer 4 whose impurity concentration and thickness are approximately $1\times10^{16}$ cm$^{-3}$ and approximately 0.4 μm respectively is formed on the layers 2 and 3. Field oxides 5 isolating the transistor from other devices are extended to the buried layers 2 and 3.

A silicon nitride film 6 formed on the epitaxial layer 4 and field oxides 5 has first and second openings. A p-polysilicon base contact 8 is formed on the silicon nitride film 6 around the first opening (left in FIG. 2). The base contact 8 has an opening disposed so as to be superposed on the first opening of the film 6.

The surface of the base contact 8 and the exposed surface of the silicon nitride film 6 are covered with a silicon dioxide film 10. The film 10 has three openings for emitter, base and collector electrodes 17a, 17b and 17c. The opening for the emitter electrode 17a is disposed just above the first opening of the film 6. The three superposed openings form a hole extending to the surface of the substrate 1 through the films 10 and 6 and the contact 8.

In the hole, there are provided with a silicon dioxide film 11, an intrinsic base region 12, an intrinsic base connection region 13, a silicon dioxide film 14, an emitter contact 15, an emitter region 16 and the emitter electrode 17a. A hole-side end portion of the base contact 8 projects like a visor over the substrate 1 in the hole.

The silicon dioxide film 11 is placed on the side faces confronting the hole of the silicon dioxide film 10 and the base contact 8. The film 11 however, covers the entire side face of the film 10, however, covers the upper-half side face of the contact 8 and the bottom-half side face thereof is exposed.

The intrinsic base region 12, which is made of p-single-crystal silicon having boron concentration of approximately $3\times10^{18}$ cm$^{-3}$ and thickness of approximately 60 nm, is formed on the epitaxial layer 4. The intrinsic base region 12 is disposed on the entire exposed surface of the epitaxial layer 4. The level of the bottom surface of the region 12 is lower by approximately several tens nm than that of the bottom surface of the silicon nitride film 6.

The intrinsic base connection region 13, which is made of p-polysilicon, is formed on the intrinsic base region 12 so as to surround the emitter contact 15. The region 13 is in contact with the side face of the silicon nitride film 6 and the bottom and side faces of the base contact 8. Thus, the contact area between the region 13 and contact 15 can be larger than that of the conventional semiconductor device described above. In addition, a gap is difficult to be generated between the region 13 and the film 6 on selective epitaxial growth of the region 13.

The silicon dioxide film 14, which is formed on the intrinsic base region 12 between the emitter contact 15 and the intrinsic base connection region 13, acts a sidewall spacer for insulating the contact 15 and the region 13. The outer surface of the film 14 is in contact with the region 13 and the film 11, the inner surface thereof with the emitter contact 15 and the emitter electrode 17a, and the bottom surface thereof with the intrinsic base region 12.

The emitter contact 15 is made of $n^+$-polysilicon and disposed on the intrinsic base region 12.

The emitter region 16 is and disposed just below the emitter contact 15 within the intrinsic base region 12. The surface area of the emitter region 16 is a little larger than that of the bottom of the emitter contact 15. In other words, the boundary between the region 12 and the contact 15 is positioned below the silicon dioxide film 14.

The emitter electrode 17a made of aluminum system metal is formed on the emitter contact 15 within the hole and insulated from the base contact 8 by the oxide films 11 and 14.

The base electrode 17b made of aluminum system metal is formed on the base contact 8 within the opening of the silicon dioxide film 10.

The collector contact 7 made of no impurity-doped polysilicon and the collector electrode 17c made of aluminum system metal on the contact 7 are placed within the superposed openings of the silicon nitride film 6 and the silicon dioxide film 10. The $n^+$-layer 9 obtained by phosphorus diffusion is between the collector contact 7 and the buried layer 2.

Figure 3A:
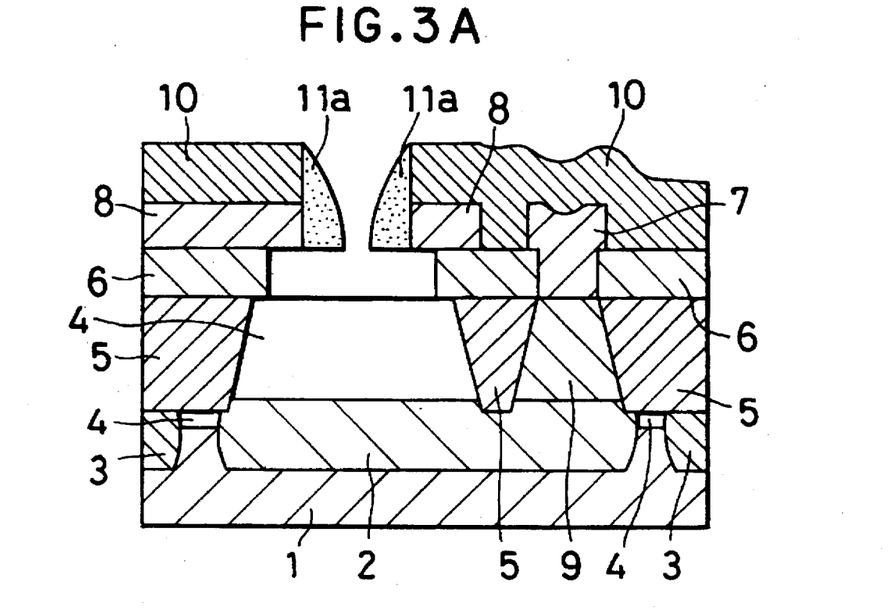
FIGS. 3A and 3B are cross-sectional views showing the fabrication process of the semiconductor device in FIG. 2.
Figure 3B:
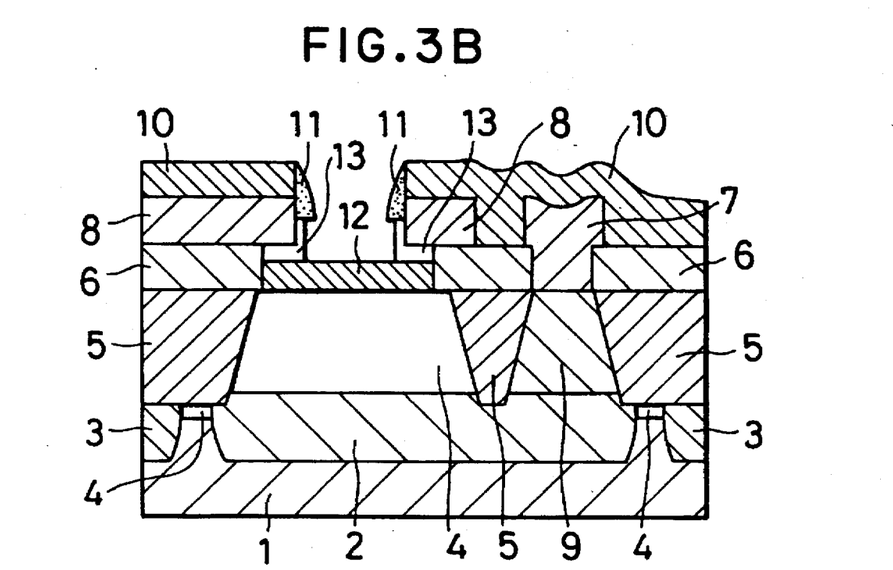

Next, the fabrication method of the above-described transistor will be shown referring to FIGS. 3A and 3B.

First, the n$^+$-buried layer is formed by arsenic diffusion into the substrate 1 and then the p$^+$-buried layers 3 are formed by boron diffusion thereinto. On the surface of the substrate 1, n-single-crystal silicon is epitaxially grown to form the epitaxial layer 4. Then, a silicon nitride film (not shown) is formed on the layer 4 and oxides 5, and thereafter the silicon nitride film is patterned to obtain a mask by lithography and dry etching techniques. The field oxides 5 for isolation are formed on the epitaxial layer 4 using the mask.

Next, silicon nitride is deposited on the epitaxial layer 4 and the field oxides 5 and then an opening for the collector contact 7 is formed in the silicon nitride film 6 thus obtained.

After polysilicon is deposited on the silicon nitride film 6 by the low pressure chemical vapor deposition (LPCVD) technique, the polysilicon film thus obtained is patterned by the ordinary photo-lithography and anisotropic dry etching techniques to form the collector contact 7 and the base contact 8 shown in FIG. 3A. Boron is selectively ion-implanted into only the base contact 8 by the ordinary photo-lithography technique to make the contact 8 p. The ion-implantation may be performed prior to the anisotropic dry etching of the polysilicon film.

Then, the surfaces of the collector and the base contacts 7 and 8 and the exposed surface of the silicon nitride film 6 are covered with a silicon nitride film (not shown). The silicon nitride film thus formed is selectively removed by the photo-lithography and dry etching techniques to form an opening just over the collector contact 7. Using the silicon nitride film thus patterned as a mask, phosphorus is selectively ion-implanted into the epitaxial layer 4 to form the n$^+$-layer 9.

After the mask of the silicon nitride film is removed by using phosphoric acid solution heated, the surfaces of the base and collector contacts 8 and 7 and the silicon nitride film 6 are covered with the silicon dioxide film 10. In the film 10 and the base contact 8, the openings shown in FIG. 3A are formed by the ordinary photo-lithography and anisotropic etching techniques.

After removing the photoresist for forming the openings, a silicon dioxide film (not shown) is deposited on the silicon dioxide film 10 by the LPCVD method. The silicon dioxide film thus deposited is removed other than the portion on the inner side faces of the film 10 and the base contact 8 to form the silicon dioxide film 11a narrowing the openings, as shown in FIG. 3A.

Then, the silicon nitride film 6 is etched by using phosphoric acid solution heated in the hole. The inner end of the film 6 is removed laterally, or in the direction parallel to the substrate 1, by the etching and thereby to make the inner end of the base contact 8 projected over the substrate 1 like a visor. The etching process is performed so as not to attain to the field oxides 5.

The substrate 1 shown in FIG. 3A is dipped into buffered hydrofluoric acid solution. By the dipping, thickness of the silicon dioxide films 10 and 11a are reduced as well as the bottom portion of the film 11a is removed to make the side face of the base contact 8 partially exposed, as shown in FIG. 3B.

Next, by the gas source molecular beam epitaxy (MBE) technique or the ultra-high vacuum chemical vapor deposition (UHV/CVD) technique, epitaxial silicon is selectively grown fin the hole. As a result, the intrinsic base region 12 made of p-single-crystal silicon and the intrinsic base connection region 13 made of p-polysilicon are formed, as shown in FIG. 3B.

In the growth process, p-single-crystal silicon grows on the epitaxial layer 4 in the upper direction perpendicular to the substrate 1, and on the other hand, p-single-crystal silicon grows on the bottom and side faces of the base contact 8 in the lower direction perpendicular to the substrate 1 and in the direction parallel to the substrate 1 toward the center of the hole, respectively. As shown in FIG. 3B, the intrinsic base region 12 and the intrinsic base connection region 13 are in contact with each other at the height that equals to about a half of the total thickness of the silicon nitride film 6. The top end of the intrinsic base connection region 13 is in contact with the silicon nitride film 11.

For example, selective crystal growth of silicon by the gas source MBE technique may be performed under the condition that substrate temperature is 560° C., a dopant is boron, and a silicon gas source is $Si_2H_6$ (supply rate: 70 sccm). In this case, boron concentration and thickness of the intrinsic base region 12 are, for example, approximately $3 \times 10^{18}$ cm$^{-3}$ and approximately 60 nm, respectively.

Next, a silicon dioxide film is formed to cover the surfaces of the silicon dioxide film 10 and 11, the intrinsic base region 12, and the intrinsic base connection region 13. Then, the silicon dioxide film thus formed is removed by the anisotropic dry etching technique to form the sidewall spacer 14, as shown in FIG. 2.

After a polysilicon is selectively deposited in the sidewall spacer to form the emitter contact 15, arsenic is ion-implanted into the contact 15 and then heat-treatment of the contact 15 is performed. The contact 15 is doped with n-dopant by the ion-implantation process, and the arsenic ions are diffused into the intrinsic base region 12 by the heat-treatment process thereby to form the n-emitter region 16 in the region 12.

The two openings for the electrodes 17b and 17c are formed in the silicon dioxide film 10, and thereafter an aluminum system metal film is formed on the film 10. The metal film is then patterned to form the base electrode 17b on the base contact 8 and the collector electrode 17c on the collector contact 7 as well as the emitter electrode 17a on the emitter contact 15 in the hole. As described above, the bipolar transistor shown in FIG. 2 is obtained.

It will be understood from the above description that the intrinsic base region 12 is formed in self-alignment in the hole.

Figure 4:
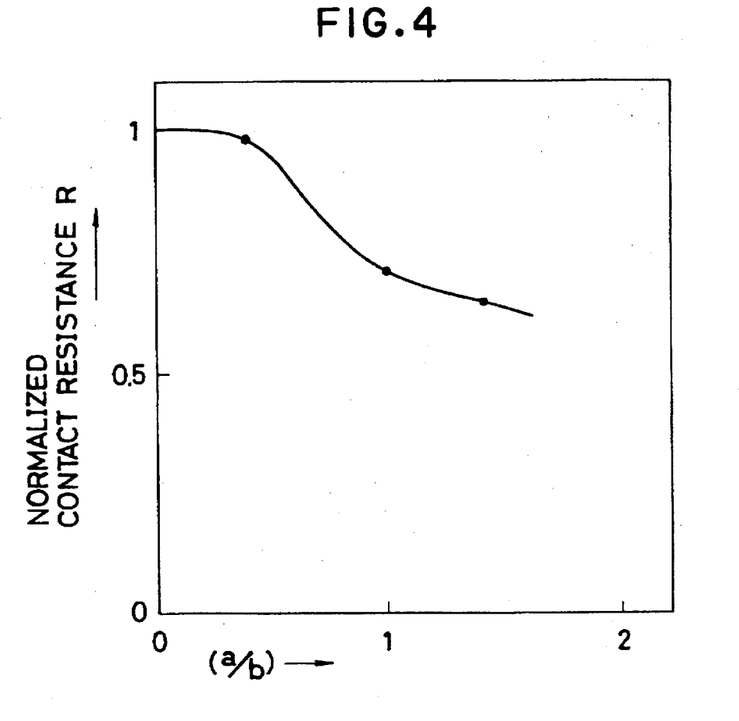
FIG. 4 is a graph showing the change of the contact resistance R of the semiconductor device in FIG. 2 as a function of (a/b).

FIG. 4 shows the change of the normalized contact resistance R as a function of a ratio (a/b) between the height a of the exposed (not covered with the silicon dioxide film 11) side face of the base contact 8 and the width b of the exposed (not contacted to the silicon nitride film 6) bottom face thereof. The sum of a and b is approximately constant, which is approximately 200 nm in the graph.

In the conventional transistor shown in FIG. 1, a≈0 nm and b=200 nm, or (a/b)≈0. It will be understood from FIG. 4 that the contact resistance R is approximately 0.7 in case of a=b=1, or (1/b)=1, which is reduced by about 30% in comparison with the conventional transistor.

In case of (a/b)>1, the effect of reducing the resistance R is not so remarkable in comparison with that of the case of (a/b)<1.0 that preferably range thereof is 0<(a/b)≦1.0, and further preferably range is 0.5≦(a/b)≦1.0.

In case that the entire side face of the base contact 8 is exposed (does not covered with the silicon dioxide film 11), the crystal growth rate in the direction parallel to the substrate 1 is larger than that in the direction perpendicular to the substrate 1 by about one figure, so that it is not adequate in transistor fabrication process.

In the embodiment, a silicon nitride film may be used in place of the silicon dioxide film, and in contrast with this, a silicon dioxide film may be used in place of the silicon nitride film.

[Second embodiment]

Figure 5:
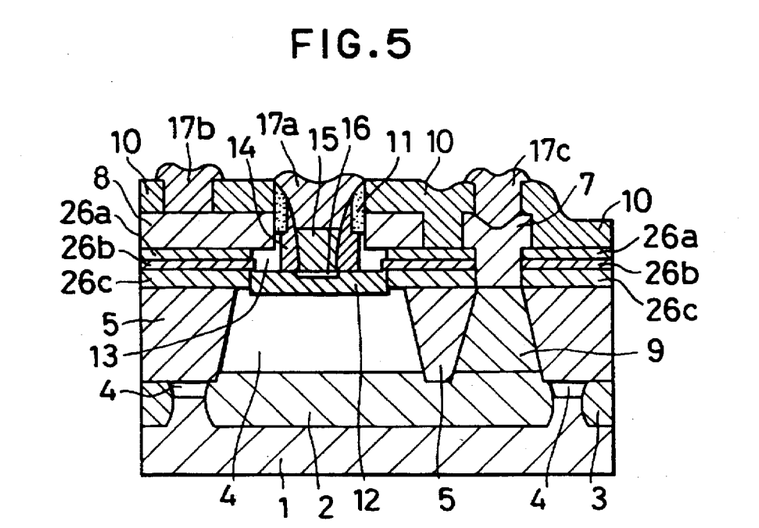
FIG. 5 is a cross-sectional view of a semiconductor device according to a second embodiment of the present invention.

FIG. 5 shows an npn-bipolar transistor according to a second embodiment of the present invention. The transistor of the second embodiment has the same structure as that of the first embodiment other than that a silicon dioxide film 26a, a silicon nitride film 26b and a silicon dioxide film 26c are used in place of the silicon nitride film 6.

In the second embodiment, when the end of the silicon nitride film 26b is etched using the phosphoric acid solution heated, the side and bottom faces of the projected end of the base contact 8 and the top face of the n-epitaxial layer 4 are protected by the silicon dioxide films 26a and 26c, respectively. Thus, there is provided with an advantage that the state of the faces can be kept well.

[Third embodiment]

Figure 6:
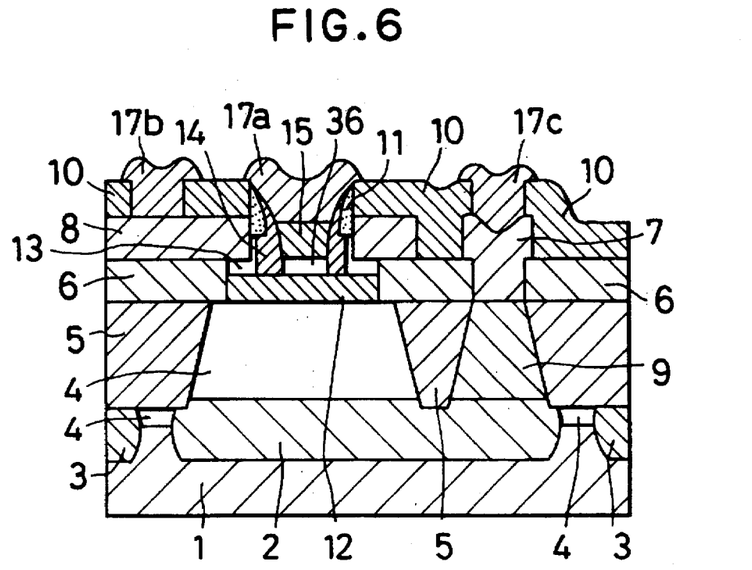
FIG. 6 is a cross-sectional view of a semiconductor device according to a third embodiment of the present invention.

FIG. 6 shows an npn-bipolar transistor according to a third embodiment of the present invention. The transistor of the third embodiment has the same structure as that of the first embodiment other than that an emitter region 36 is formed on the intrinsic base region 12 not in the region 12. The emitter region 36 is obtained by the selective epitaxial growth process like the intrinsic base region 12.

[Fourth embodiment]

Figure 7:
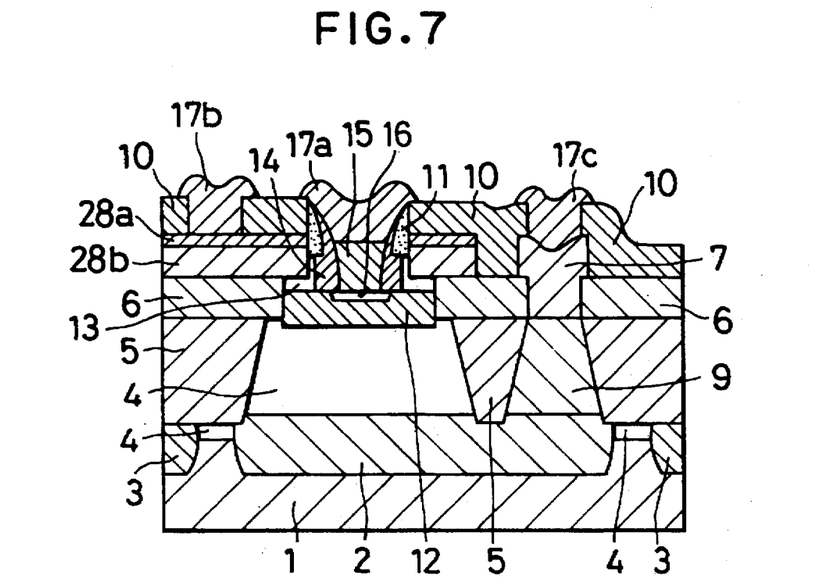
FIG. 7 is a cross-sectional view of a semiconductor device according to a fourth embodiment of the present invention.

FIG. 7 shows an npn-bipolar transistor according to a fourth embodiment of the present invention. The transistor of the fourth embodiment has the same structure as that of the first embodiment other than that a silicide layer 28a of $WSi_2$ is provided on the base contact layer 28b made of p-polysilicon as in the first embodiment. Total thickness of the layers 28a and 28b is equal to that of the base contact layer 8 in the first embodiment.

In the fourth embodiment, there is provided with an advantage that resistance of the base contact layer 28b is lower than that of the first embodiment.

[Fifth embodiment]

Figure 8:
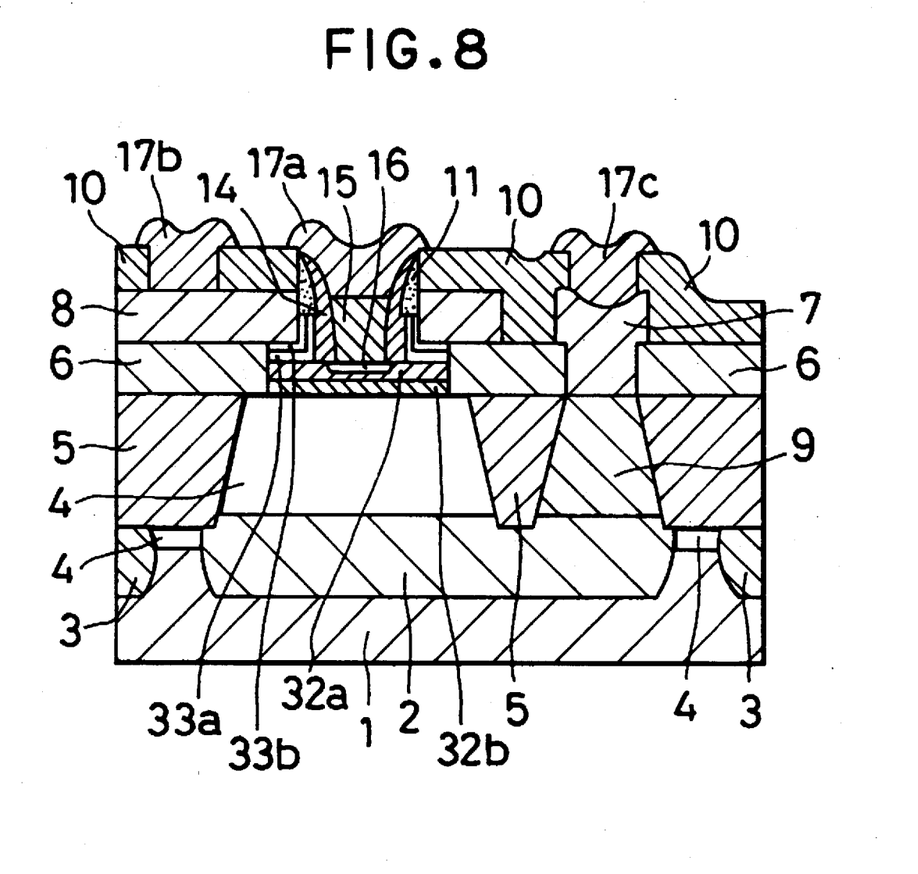
FIG. 8 is a cross-sectional view of a semiconductor device according to a fifth embodiment of the present invention.

FIG. 8 shows an npn-bipolar transistor according to a fifth embodiment of the present invention. The transistor of the third embodiment has the same structure as that of the first embodiment other than that a p-single-crystal SiGe layer 32a and a $p^-$-single-crystal silicon layer 32b are provided as an intrinsic base region, and a p-polycrystalline SiGe layer 33a and a p-polysilicon layer 33b are provide as an intrinsic base connection region. The emitter region 16 is formed in the layer 32a. The layer 33a is placed adjacent to the SiGe layer 32a and the polysilicon layer 33b is placed adjacent to the base contact 8.

In the fifth embodiment, the positions of the base-collector p-n junction and the SiGe/Si heterojunction are in accordance with each other, so that no potential barrier is generated which obstruct the minority carrier to flow into the collector region. Besides, the base-emitter p-n junction is formed in the SiGe layer. Thus, there is provided with an advantage that dispersion of $h_{FE}$ can be suppressed so as to be the same as that of a silicon bipolar transistor.

In the first to fifth embodiments, contact area between the base contact and the base connection region can be larger than that of the conventional transistor, so that an advantage that the contact resistance therebetween can be reduced is obtained.

Besides, the capacitance of the collector-base junction $C_{CB}$ in proportion to the bottom face area of the projected portion of the base contact. In the embodiments, since the area can be smaller than that of the conventional one, even if the contact resistance is equal to that of the conventional one, the capacitance $C_{CB}$ can be made smaller. As a result, the improved operation speed of the transistor can be obtained.

In the above description, npn-bipolar transistors are disclosed, however, the present invention can be applied to a pnp-bipolar transistor and other devices than bipolar transistors. It is to be understood that the present invention is not limited to the embodiments except as defined in the appended claims.

What is claimed is:

1. A semiconductor device comprising:

a single-crystal semiconductor substrate of a first conductivity type;

a first insulation film formed on said semiconductor substrate, said first insulation film having an opening formed therein and having upper and lower surfaces;

a first semiconductor contact region formed on said first insulation film, said first semiconductor contact region having an opening formed therein and a bottom face;

a second insulation film formed on said first semiconductor contact region, said second insulation film having an opening formed therein;

said openings in said first insulation film, said first semiconductor contact region and said second insulation film being overlapped so that said openings form a hole that penetrates through said first insulation film, said first semiconductor contact region and said second insulation film;

an inner end part of said first contact region being laterally projected into said hole, said inner end having a side face that faces said hole and a bottom face that extends outward past said first insulation film;

a first semiconductor active region of said first conductivity type formed on the substrate, said first semiconductor active region being positioned in said hole and having a top that is higher than said lower surface of said first insulation film and lower than said upper surface of said first insulation film;

a second semiconductor active region of a second conductivity type opposite in polarity with said first conductivity type formed to be contacted with said first semiconductor active region, said second semiconductor active region being positioned in said hole and having a top;

a semiconductor connection region for connecting said first semiconductor active region with said first semiconductor contact region, said semiconductor connection region being formed in said hole to be contacted with said face of said inner end part of said first semiconductor contact region and with said bottom face thereof;

a second semiconductor contact region formed to be contacted with said second active region, said second semiconductor contact region being positioned in said hole; and an insulation spacer for insulating said semiconductor connection region and said second semiconductor contact region, said insulation spacer being formed between said first semiconductor contact region and said second semiconductor active region;

wherein said first semiconductor active region is made of a single-crystal semiconductor that is produced through an epitaxial growth process on said substrate, such that said first semiconductor active region has a substantially uniform dopant concentration;

wherein said second semiconductor connection region is made of a polycrystalline semiconductor that is produced through said epitaxial growth process on said side and bottom faces of said inner end part of said first contact region; and wherein a contact resistance between said first semiconductor contact region and said semiconductor connection is reduced.

2. The semiconductor device according to claim 1, wherein said second semiconductor active region is formed in said first semiconductor active region;

and wherein said top of said second semiconductor active region is exposed from said first semiconductor active region to be contacted with said second contact region.

3. The semiconductor device according to claim 1, wherein said second semiconductor active region is formed on said top of said first semiconductor active region; and wherein said insulation spacer insulates said second semiconductor active region from said semiconductor connection region.

4. The semiconductor device according to claim 1, wherein said semiconductor connection region comprises a polysilicon layer of said second conductivity type and a polycrystalline silicon-germanium alloy layer of said second conductivity type.

5. The semiconductor device according to claim 4, wherein said polysilicon layer is in contact with said first semiconductor contact region and said polycrystalline silicon-germanium alloy layer is in contact with said first semiconductor active region.

6. The semiconductor device according to claim 1, wherein said first semiconductor active region comprises a single-crystal silicon layer of said first conductivity type and a single-crystal silicon-germanium alloy layer of said first conductivity type.

7. The semiconductor device according to claim 6, wherein said single-crystal silicon layer is in contact with said substrate and said single-crystal silicon-germanium alloy layer is in contact with said second semiconductor active region.

8. The semiconductor device according to claim 1, wherein a silicide film of a refractory metal is provided between said first semiconductor contact region and said second insulation film.

9. The semiconductor device according to claim 1, wherein said first insulation film includes a silicon dioxide film and a silicon nitride film.

10. The semiconductor device according to claim 1, wherein said insulation spacer is of multi-layer structure composed of insulation layers.

11. The semiconductor device according to claim 1, wherein when a total thickness of said first semiconductor contact region is defined as t, and a vertical length of said side face of said inner end of said first semiconductor contact region is defined as h, said side face being contacted with said semiconductor connection region, the ratio of (h/t) satisfies the following relationship: $0 < (h/t) \leq 0.5$.

12. The semiconductor device according to claim 1, wherein when a height of said side face of said inner end of said first semiconductor contact region contacted with said semiconductor connection region is defined as a, and a width of said bottom face of said inner end of said first semiconductor contact region contacted with said semiconductor connection region is defined as b, the ratio of (a/b) satisfies the following relationship: $0 < (a/b) \leq 1.0$.

13. The semiconductor device according to claim 1, wherein when a height of said side face of said inner end of said first semiconductor contact region contacted with said semiconductor connection region is defined as a, and a width of said bottom face of said inner end of said first semiconductor contact region contacted with said semiconductor connection region is defined as b, the ratio of (a/b) satisfies the following relationship: $0.5 \leq (a/b) \leq 1.0$.

14. The semiconductor device according to claim 1, wherein said first and second semiconductor active regions are made of single-crystal silicon having a plane orientation of (100).

15. The semiconductor device according to claim 1, wherein said first semiconductor active region serves as a base region and said second semiconductor active region serves as an emitter region.

16. The semiconductor device according to claim 1, wherein said first and second semiconductor active regions are made of single-crystal silicon and said semiconductor connection region is made of polysilicon.

17. A semiconductor device including a bipolar transistor comprising:

a semiconductor substrate of a first conductivity type;

a first insulation film formed on said semiconductor substrate, said first insulation film having an opening formed therein and having upper and lower surfaces;

a semiconductor base contact region formed on said first insulation film, said base contact region having an opening formed therein and a bottom face;

a second insulation film formed on said semiconductor base contact region, said second insulation film having an opening formed therein;

said openings in said first insulation film, said semiconductor base contact region and said second insulation film being overlapped so that said openings form a hole that penetrates through said first insulation film, said base contact region and said second insulation film;

an inner end part of said base contact region being laterally projected into said hole, said inner end part having a side face that faces said hole and bottom face that extends outward past said first insulation film;

a semiconductor base region of said first conductivity type formed on said substrate, said base region being positioned in said hole and having a top that is higher than said lower surface of said first insulation film and lower than said upper surface of said first insulation film;

a semiconductor emitter region of a second conductivity type opposite in polarity with said first conductivity type formed to be contacted with said base region, said emitter region being positioned in said hole and having a top;

a semiconductor base connection region for connecting said base region with said base contact region, said base connection region being formed in said hole to be contacted with said side face of said inner end part of said base contact region and with said bottom face thereof;

an emitter contact region formed to be contacted with said emitter region, said emitter contact region being positioned in said hole; and an insulation spacer for insulating said base connection region and said emitter contact region, said insulation spacer being formed between said base contact region and said emitter region;

wherein said base region is made of a single-crystal semiconductor that is produced through an epitaxial growth process on said substrate, such that said base region has a substantially uniform dopant concentration;

wherein said base connection region is made of a polycrystalline semiconductor that is produced through an epitaxial growth process on said substrate; and wherein a contact resistance between said base contact region and said base connection is reduced.

18. The semiconductor device according to claim 17, wherein said emitter region is formed in said base region;

and wherein said top of said emitter region is exposed from said base region to be contacted with said emitter contact region.

19. The semiconductor device according to claim 17, wherein said emitter region is formed on said top of said base region.

20. The semiconductor device according to claim 17, wherein said base connection region comprises a polysilicon layer of said second conductivity type and a polycrystalline silicon-germanium alloy layer of said second conductivity type.

21. The semiconductor device according to claim 20, wherein said polysilicon layer is in contact with said base contact region and said polycrystalline silicon-germanium alloy layer is in contact with said base region.

22. The semiconductor device according to claim 17, wherein said first semiconductor base region comprises a single-crystal silicon layer of said first conductivity type and a single-crystal silicon-germanium alloy layer of said first conductivity type.

23. The semiconductor device according to claim 22, wherein said single-crystal silicon layer is in contact with said substrate and said single-crystal silicon-germanium alloy layer is in contact with said emitter region.

24. The semiconductor device according to claim 17, wherein a silicide film of a refractory metal is provided between said base contact region and said second insulation film.

25. The semiconductor device according to claim 17, wherein said first insulation film includes a silicon dioxide film and a silicon nitride film.

26. The semiconductor device according to claim 17, wherein said insulation spacer is of multi-layer structure composed of insulation layers.

27. The semiconductor device according to claim 17, wherein when a total thickness of said semiconductor base contact region is defined as t, and a vertical length of said side face of said inner end of said first semiconductor contact region is defined as h, said side face being contacted with said semiconductor connection region, (h/t) satisfies the following relationship: $0<(h/t)\leq 0.5$.

28. The semiconductor device according to claim 17, wherein when a height of said side face of said inner end of said base contact region contacted with said base connection region is defined as a, and a width of said bottom face of said inner end of said base contact region contacted with said base connection region is defined as b, the ratio of (a/b) satisfies the following relationship: $0<(a/b)\leq 1.0$.

29. The semiconductor device according to claim 17, wherein when a height of said side face of said inner end of said base contact region contacted with said base connection region is defined as a, and a width of said bottom face of said inner end of said base contact region contacted with said base connection region is defined as b, the ratio of (a/b) satisfies the following relationship: $0.5\leq (a/b)\leq 1.0$.

30. The semiconductor device according to claim 17, wherein said base region and said emitter region are made of single-crystal silicon having a plane orientation of (100).

31. The semiconductor device according to claim 17, wherein said base region and said emitter region are made of single-crystal silicon and said base connection region is made of polysilicon.

* * * * *